United States Patent [19]
Crowder et al.

[11] Patent Number: 5,446,243
[45] Date of Patent: Aug. 29, 1995

[54] POST PROCESSING SHIELDING

[75] Inventors: George Crowder, Poughkeepsie; Roger A. Rippens, Salt Point, both of N.Y.

[73] Assignee: International Business Machines Corporation, Armonk, N.Y.

[21] Appl. No.: 209,355

[22] Filed: Feb. 23, 1994

Related U.S. Application Data

[63] Continuation of Ser. No. 886,545, May 20, 1992, abandoned.

[51] Int. Cl.[6] .............................................. H05K 1/00
[52] U.S. Cl. ................... 174/250; 174/262; 174/264
[58] Field of Search ............... 174/250, 262, 264, 266; 361/784, 792

[56] References Cited

U.S. PATENT DOCUMENTS

| | | | |
|---|---|---|---|
| 4,785,135 | 11/1988 | Ecker et al. | 174/34 |
| 4,933,743 | 6/1990 | Thomas et al. | |
| 5,006,918 | 4/1991 | Deutsch et al. | 357/71 |
| 5,012,047 | 4/1991 | Dohya | |
| 5,012,213 | 4/1991 | Tsai | |

FOREIGN PATENT DOCUMENTS

| | | |
|---|---|---|
| 2243578 | 4/1975 | France |
| 2264112 | 7/1974 | Germany |
| 2092830 | 8/1982 | United Kingdom |

OTHER PUBLICATIONS

Havant GB, "Printed Circuit Card/Board Shielded Assembly", Research Disclosure, No. 285, p. 56, Jan. 1988.

Primary Examiner—Leo P. Picard
Assistant Examiner—Cheryl R. Figlin
Attorney, Agent, or Firm—Lawrence D. Cutter

[57] ABSTRACT

A system and method for reducing coupled noise in a multilayer circuit board having signal lines disposed within a set of wiring channels on each of a plurality of the layers; and, a vias disposed within a set of via channels. According to a first embodiment, otherwise unused vias traverse the layers and are connected with otherwise unused signal lines to form electrical nets, thus reducing coupled noise throughout the module. In the context of the above-described environment, a method for reducing coupled noise includes the steps of determining the locations of unused ones of the wiring channels and unused ones of the via channels; providing shield lines disposed within the unused wiring channels and unused via channels; and, interconnecting the shield lines with one another and to a reference voltage by way of at least one terminating resistance.

6 Claims, 6 Drawing Sheets

POST PROCESSING SHIELDING

This is a continuation of copending application Ser. No. 07/886,545, filed on May 20, 1992, now abandoned.

BACKGROUND OF THE INVENTION

1. Field of the Invention

The present invention is directed to the reduction of coupled noise in parallel conductors on circuit boards or integrated circuit modules.

2. Related Art

High performance integrated circuit packages, and in particular in packages having multilayer printed circuit boards or substrates, wiring planes typically include a number of closely disposed conductors lying parallel to one another. Continual effort is being expended to form insulated packages carrying conductors in greater numbers. This is often accomplished by providing conductors having smaller cross sections and closer center-to-center spacing. In multilayer substrates, an increase in conductors is also commonly provided by increasing the number of layers of circuits per unit thickness.

As conductor density increases, in the various levels of packaging such as VLSI chips, chip carriers, circuit cards and boards, the problem of coupled noise or cross talk among conductors assumes greater prominence. This noise results from voltages induced in a quiet conductor by the switching of currents in other, parallel, nearby energized conductors. The adversely effected conductors lie within a proximity region whose effective radius from an energized conductor varies with with signal frequency, parasitic capacitance, inductance, source and termination impedance, dielectric constant, distance to ground and voltage plane, extent of conductor parallelism and other factors. As more conductors are placed within a volume, high frequency switching induces voltage levels that can be falsely detected as data, resulting in processing errors.

The prior art includes a number of methods for reducing coupled noise between parallel conductors. Examples of prior art solutions include reducing conductor size to enlarge separation, decreasing dielectric constant of insulators or placing ground reference planes nearby. While each of these solutions provides some degree of relief, each has its problems. For example increasing the separation distance of conductors on a given plane may decrease the achievable wiring density. Further, since closely disposed conductors lying in parallel to one another are subject to cross talk, whether in the same or adjacent planes, the distance between neighboring conductors on a given plane may not be the dispositive factor in providing an acceptable signal to noise ratio. The use of ground planes between signal planes, while helpful, adds to the expense of fabrication and, in any event, does not completely dispose of the cross talk between conductors on the same substrate layer. Further, while combinations of these solution can be implemented, this may still not be sufficiently improve the signal to noise ratio in conductors operating at low voltages.

U.S. Pat. No. 4,785,135 to Ecker et al. describes an arrangement for reducing cross talk between electrical circuit conductors wherein conductors lying within each others induced voltage or cross talk region are arranged in parallel or common substrate channels so as to converge or diverge with respect to one another. A problem with Ecker is that shifting conductors from their normal parallel locations adds a complicating factor for wiring layout calculations.

U.S. Pat. No. 5,006,918 to Deutsh et al. describes an arrangement wherein far end wiring noise caused by coupling between active and quiet signal lines of wiring planes of an integrated circuit chip or chip carrier is reduced by providing floating crossing lines in wiring layers in an X-Y wiring plane pair. While Deutsh deals with the reduction of far end noise, other factors, for example near end noise, can also cause significant problems.

Thus, there is a need to further reduce coupled noise between conductors on multilayer circuit boards.

SUMMARY OF THE INVENTION

In light of the above, there is provided a system and method for reducing coupled noise in a multilayer circuit board or other electronic substrate having signal lines disposed within a set of wiring channels on each of a plurality of the layers; and, vias disposed within a set of via channels. According to an embodiment of the present invention, otherwise unused vias traverse the layers and are connected with otherwise unused signal lines to form electrical nets, thus reducing coupled noise throughout the module.

In the context of the above-described environment, a method for reducing coupled noise according to an embodiment of the present invention, includes the steps of determining the locations of unused ones of the wiring channels and unused ones of the via channels; providing shield lines disposed within the unused wiring channels and unused via channels; and, interconnecting the shield lines with one another and to a reference voltage by way of at least one terminating resistance.

BRIEF DESCRIPTION OF THE DRAWINGS

The invention will be better understood by reference to the appended drawing, wherein.

Like reference numerals appearing in more than one FIGURE designate like elements.

DETAILED DESCRIPTION OF THE PREFERRED EMBODIMENT

Figure 1:
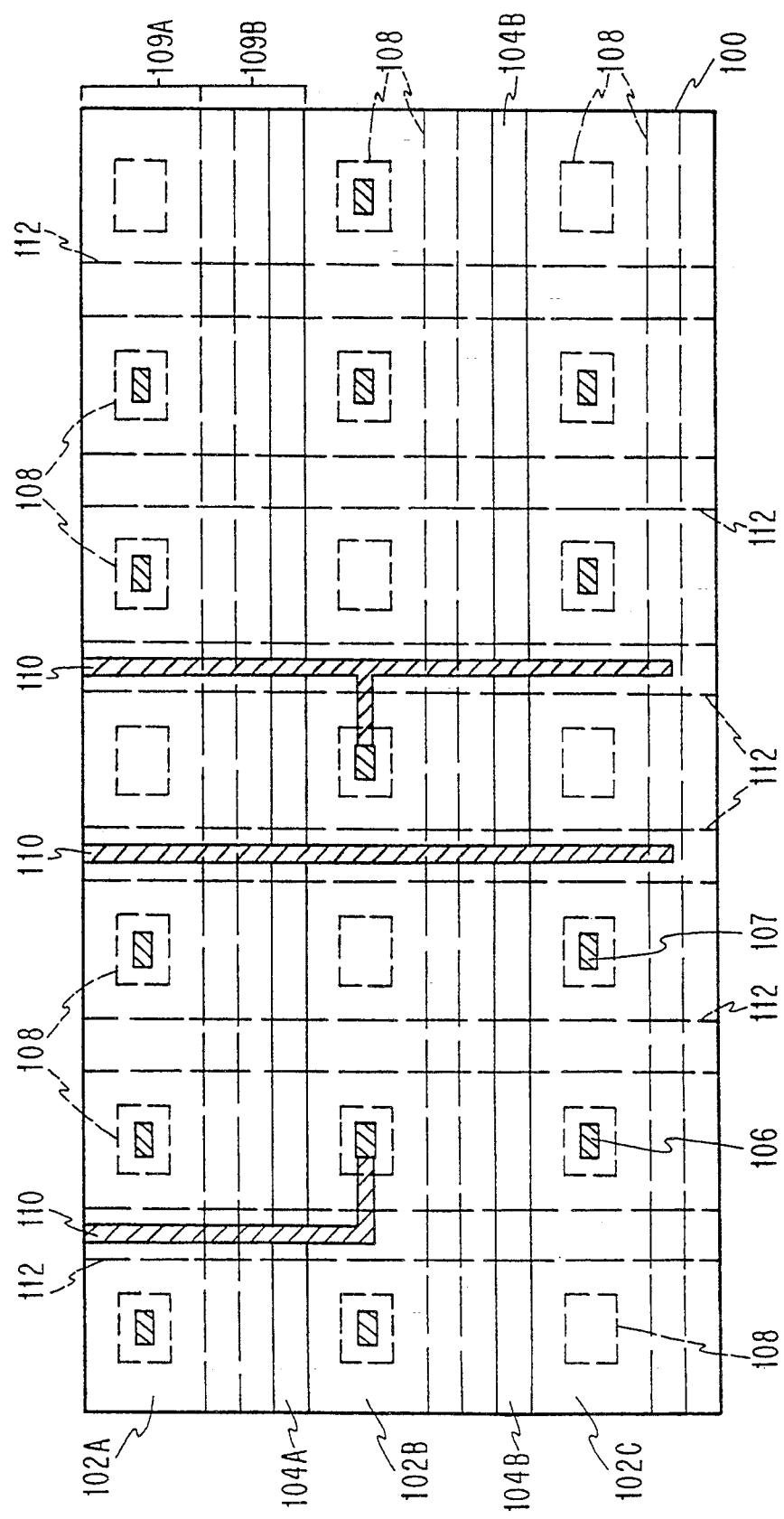
FIG. 1 is a side view of a multilayer circuit board having a number of unused wiring channels and via channels.
Figure 2:
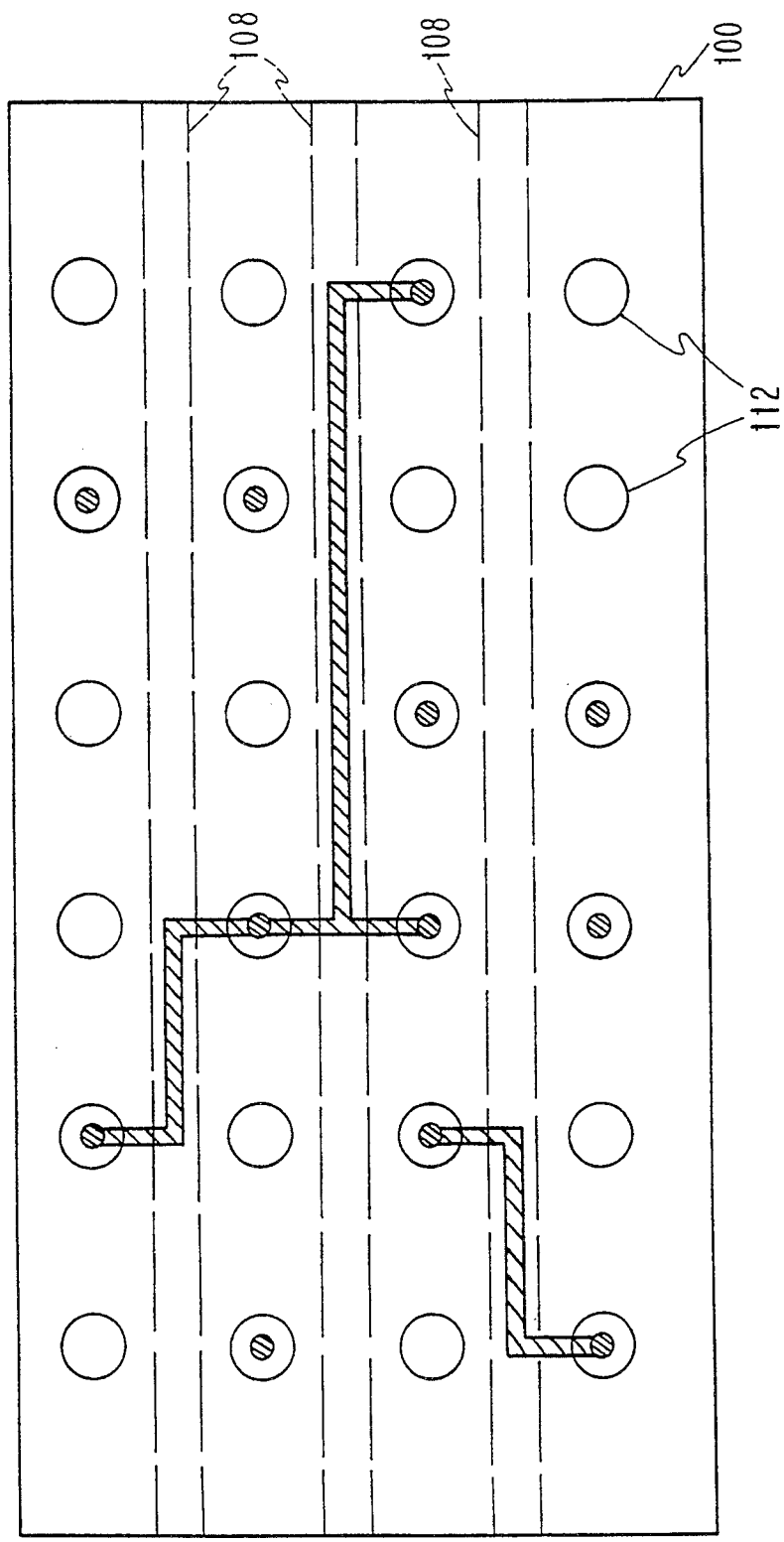
FIG. 2 is a top view of the circuit board of FIG. 1.

Turning first to FIGS. 1 and 2, a prior art multilayer circuit board is shown. As is conventional, the circuit board 100 of FIG. 1 includes a number of signal planes 102(a-c) and a number of ground planes 104(a,b), in the form of a copper mesh, disposed between the signal planes. Each signal plane includes an X layer 109A and a Y layer 109B. The X layer carries conductors oriented in the X direction (into FIG. 1). The Y layer carries signal lines which run in the Y direction (left to right across FIG. 1). Signal lines 106 and ground lines 107 are located within fixed wiring channels 108 on each signal plane. Similarly, a number of vias 110, located in fixed via channels 112, traverse the layers and selectively interconnect various ones of the signal lines. As is conventional, a number of the wiring channels 108 and via channels 112 are empty (not used).

A top cutaway view of the circuit board of FIG. 1 is illustrated in FIG. 2.

In the circuit board of FIGS. 1 and 2, coupled noise can be induced in a number of ways as described in the Related Art section of this document. The present invention reduces both far end and near end coupled noise in via and signal lines. This is accomplished by filling the unused via and wiring channels channels with conductors, connecting the conductors together into an electrical mesh and tying the mesh to a reference voltage. By keeping the electrical integrity of the mesh to the reference voltage, a path for return currents is provided. In this manner both near end and far end noise reduction is achieved.

Figure 3:
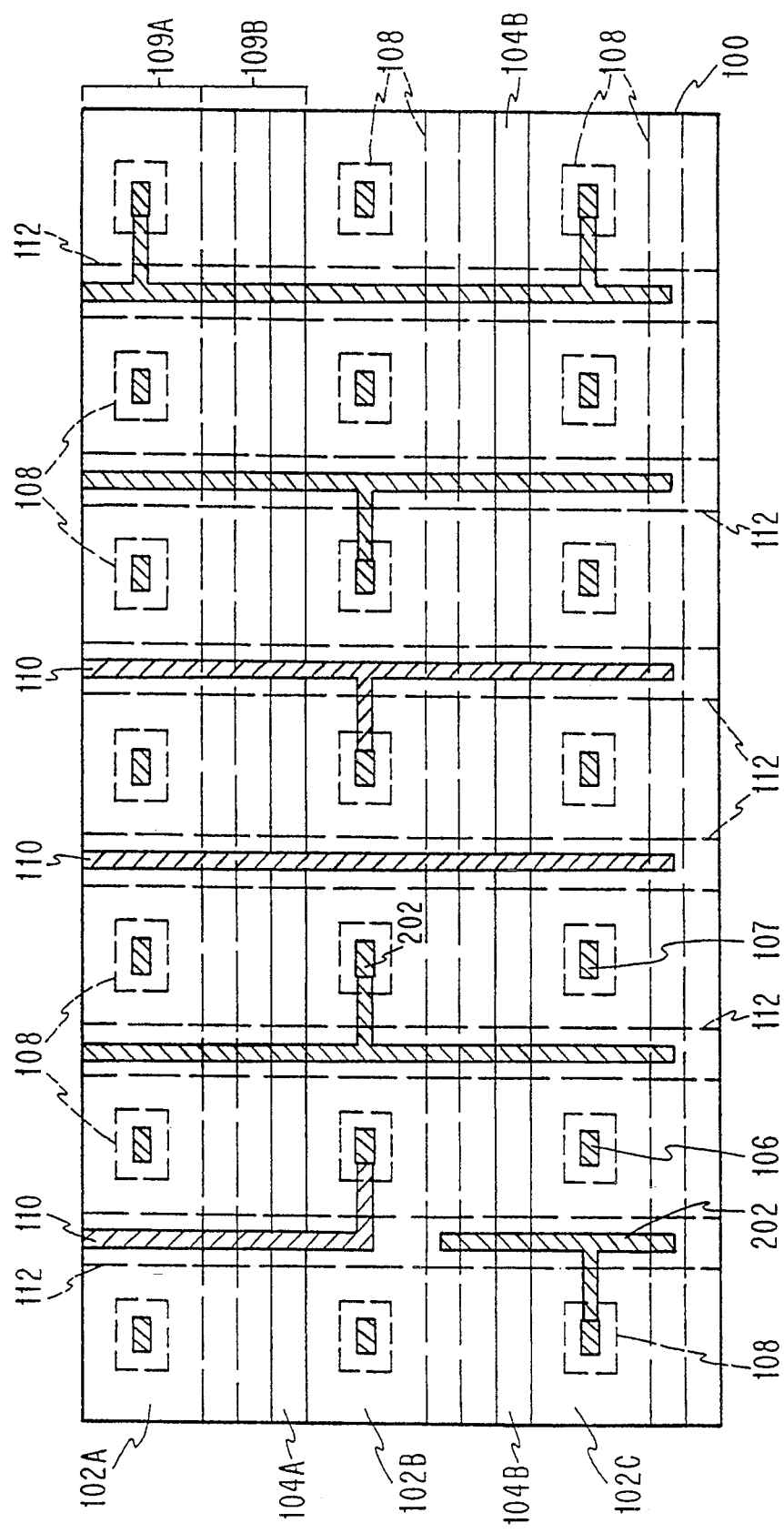
FIG. 3 is a side view of an improved circuit board according to an embodiment of the present invention.
Figure 4:
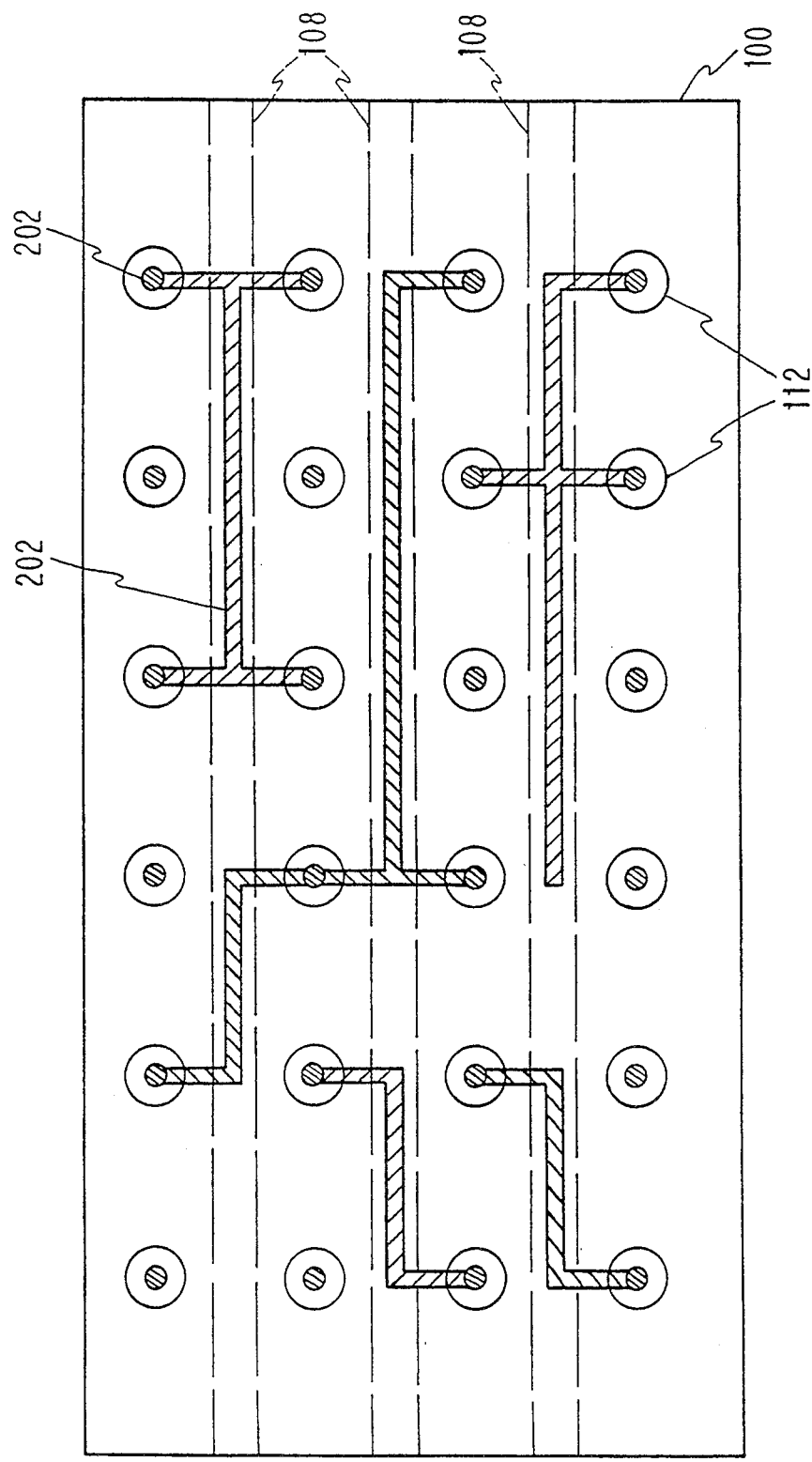
FIG. 4 is a top view of the circuit board of FIG. 3.

The invention will be better understood by reference to FIGS. 3 and 4. FIGS. 3 and 4 are, respectively, side and top cutaway views of the circuit board of FIGS. 1 and 2 as improved by the current invention. As illustrated in FIGS. 3 and 4, conductors 202 (preferably a low resistance material such as copper or molybdenum) are placed in each of the unused wiring channels 108 and via channels 112. The conductors are electrically connected to one another so as to form a conductive mesh within the circuit board 100. This conductive mesh is tied to a reference voltage at a number of chip sites (not shown) by way of a terminating resistor 204 of 5 K ohms or less. The terminating resistor can be completely eliminated under circumstances where design constraints allow. As a further modification, the conductive mesh can also be connected to each of the ground planes, either directly or through a terminating resistance, to provide further noise reduction.

Figure 5:
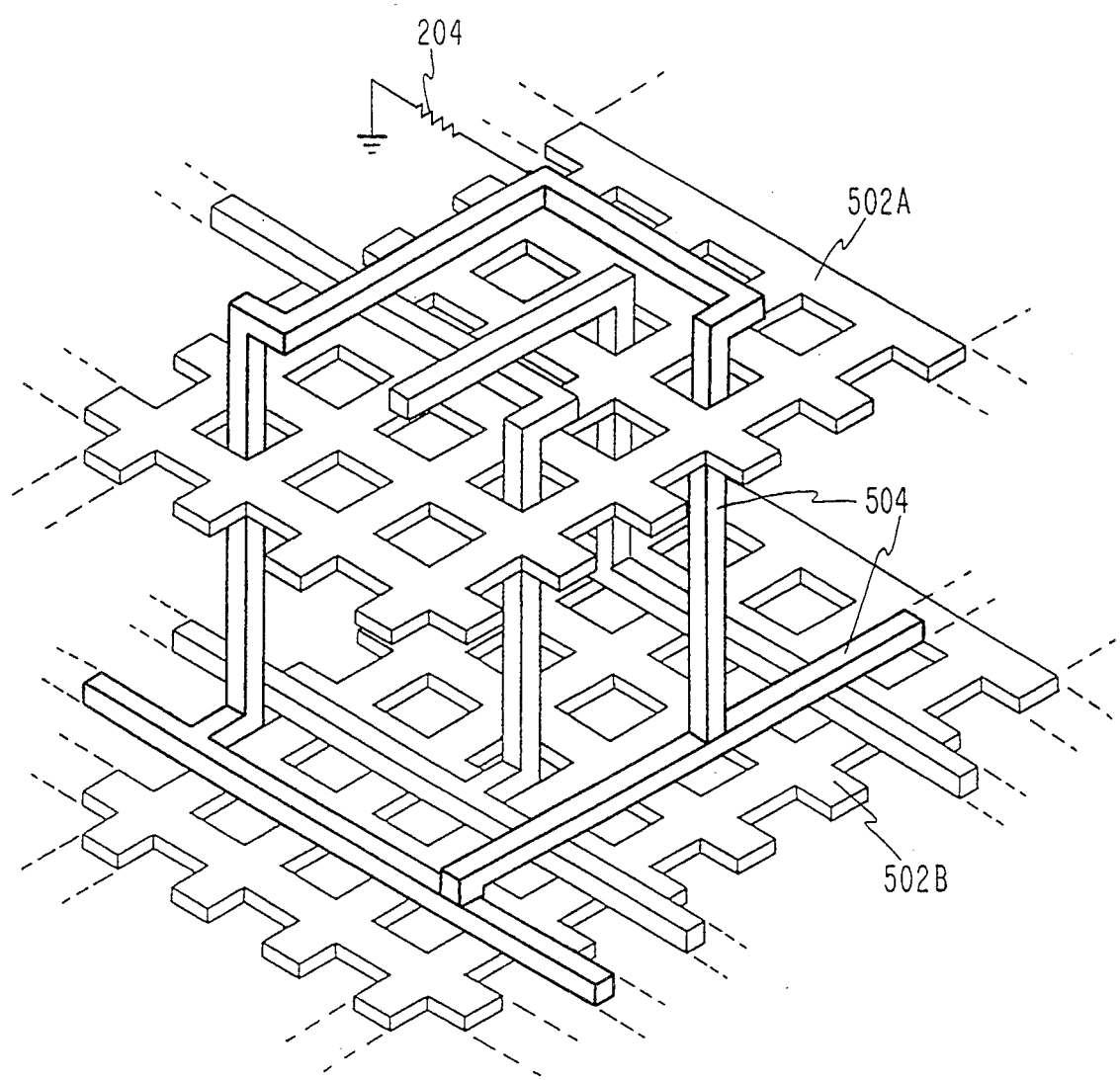
FIG. 5 is an isometric view of a portion of a circuit board according to an embodiment of the present invention (not showing the substrates)

An isometric view of a section of a circuit board according to an embodiment of the present invention, showing the ground planes 502A, B and two of the signal planes is illustrated in FIG. 5. As will be observed, X, Y signals lines and vias are surrounded be a conductive mesh 504 formed by conductors which have been placed in otherwise unused wiring and via channels. Preferably, to the extent possible, every empty wiring and via channel is filled with a conductor and tied into the conductive mesh. Again, the conductive mesh is tied to a reference voltage either directly or through a terminating resistor and can further be electrically connected to each of the ground planes.

Figure 6:
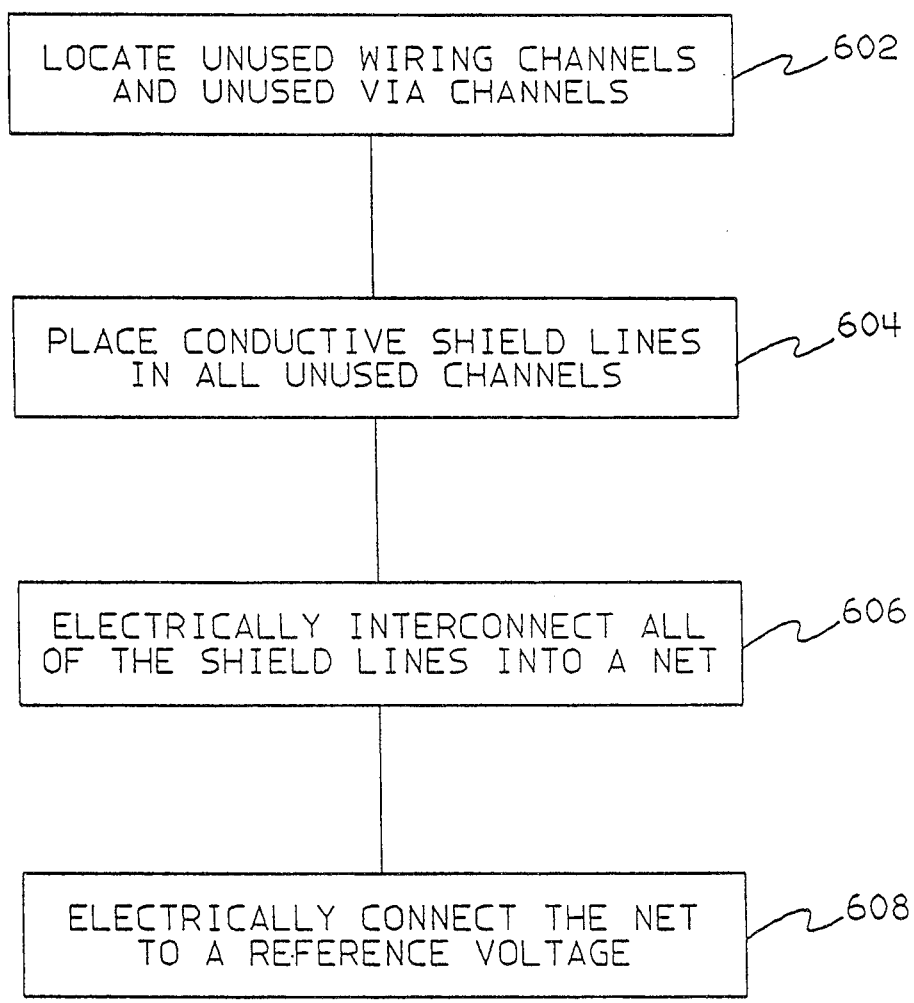
FIG. 6 is a flow chart of a method of reducing coupled noise in the circuit board of FIGS. 1 and 2, according to an embodiment of the present invention.

In the context of the above-described environment, a method for reducing coupled noise according to an embodiment of the present invention as illustrated in FIG. 6, includes the steps of determining the locations of unused ones of the wiring channels and unused ones of the via channels (602); providing shield lines disposed within the unused wiring channels and unused via channels (604); and, interconnecting the shield lines with one another (606) and to a reference voltage (608) by way of at least one terminating resistance.

A further benefit of using the excess wiring capability to build a mesh is that the basic line parameters will have tighter tolerances. Line parameters, except resistance, are dependant on the environment, i.e. the lines surrounding the line in question. In present day circuit boards and modules, many wiring and via channels are unused, thus creating a board or module having open areas and densely wired areas. A line passing through an open area will typically have different line parameters (i.e. higher impedance and inductance, and lower capacitance) than one passing through a dense area. By eliminating the open areas to construct the above described conductive mesh, a more uniform environment is created, thus causing a reduction in the parameter differences between lines.

It should be understood, that in addition to circuit boards, the principles of the present invention can be applied to VLSI chips and other electronic packaging.

Many other modifications and variations that do not depart from the scope and spirit of the invention will now become apparent to those of skill in the art. Thus, it should be understood that the above-described embodiments of the invention have been described by way of example and not as a limitation.

We claim:

1. A method for reducing coupled noise in a multilayer circuit board having a plurality of signal lines disposed within a set of wiring channels on each of a plurality of layers, the wiring channels being greater in number than the number of signal lines; and, a plurality of vias disposed within a set of via channels and traversing the layers and connecting the signal lines into electrical nets, the via channels being greater in number than the number of bias; said method for reducing coupled noise comprising the steps of:
   determining the locations of unused ones of the wiring channels and unused ones of the via channels;
   providing shield lines disposed within the unused wiring channels and unused via channels; and,
   electrically interconnecting the shield lines with one another and to a reference voltage so as to electromagnetically shield at least one of said nets.

2. The method of claim 1 wherein the step of electrically interconnecting comprises the further step of coupling the shield lines to a ground pin pad of each of a plurality of chips on the circuit board, each by way of a terminating resistance.

3. The method of claim 1 wherein the step of electrically interconnecting comprises the further step of electrically connecting the shield lines to a ground plane of the circuit board.

4. The method of claim 2 wherein the terminating resistance is no greater than 5 thousand ohms.

5. The method of claim 3 wherein the shield lines are connected to the ground plane by way of a terminating resistance of no greater than 5 thousand ohms.

6. A method for reducing coupled noise in a multilayer circuit board having a plurality of signal lines disposed within a set of fixed wiring channels on each of a plurality of layers, the wiring channels being greater in number than the number of signal lines; and, a plurality of bias disposed within a set of fixed via channels and traversing the layers and connecting the signal lines into electrical nets, the via channels being greater in number than the number of vias; said method for reducing coupled noise comprising the steps of:
   determining the locations of unused ones of the wiring channels and unused ones of the via channels;
   providing electromagnetic shield lines disposed within the unused wiring channels and unused via channels; and,
   interconnecting the shield lines with one another, to a ground plane of the circuit board and to a ground pin pad of each of a plurality of chips on the circuit board, each by way of a terminating resistance of no greater than 5 thousand ohms.

* * * * *